United States Patent
Belot et al.

(10) Patent No.: US 7,787,853 B2
(45) Date of Patent: Aug. 31, 2010

(54) METHOD AND DEVICE FOR THE REDUCTION OF THE DC COMPONENT OF A SIGNAL TRANSPOSED INTO BASEBAND, IN PARTICULAR IN A RECEIVER OF THE DIRECT CONVERSION TYPE

(75) Inventors: Didier Belot, Rives (FR); Jean-Baptiste Begueret, Talence (FR); Yann Deval, Bordeaux (FR); Hervé Lapuyade, Pessac (FR)

(73) Assignee: STMicroelectronics SA, Montrouge (FR)

( * ) Notice: Subject to any disclaimer, the term of this patent is extended or adjusted under 35 U.S.C. 154(b) by 613 days.

(21) Appl. No.: 11/774,021

(22) Filed: Jul. 6, 2007

(65) Prior Publication Data

US 2008/0007336 A1 Jan. 10, 2008

(30) Foreign Application Priority Data

Jul. 7, 2006 (FR) .................................. 06 06204

(51) Int. Cl.
H04B 1/16 (2006.01)
(52) U.S. Cl. ...................... 455/334; 455/209; 455/260; 455/324; 375/345; 330/259
(58) Field of Classification Search ................ 455/205, 455/208, 209, 255–260, 323, 324, 334, 339, 455/340, 341; 375/345, 349; 330/259, 270
See application file for complete search history.

(56) References Cited

U.S. PATENT DOCUMENTS

| 6,504,884 | B1 * | 1/2003 | Zvonar ........................ 375/346 |
| 6,803,867 | B1 | 10/2004 | Juang ......................... 341/118 |
| 7,085,335 | B2 * | 8/2006 | Rawlins et al. .............. 375/346 |
| 7,164,901 | B2 * | 1/2007 | Zheng et al. ................. 455/324 |
| 7,171,185 | B2 * | 1/2007 | Matsumoto et al. .......... 455/324 |
| 7,603,084 | B2 * | 10/2009 | Aytur ......................... 455/63.1 |
| 7,603,094 | B2 * | 10/2009 | Rahman et al. ............. 455/241.1 |
| 2004/0002311 | A1 | 1/2004 | Feng ......................... 455/194.2 |

* cited by examiner

Primary Examiner—Nhan Le
(74) Attorney, Agent, or Firm—Lisa K. Jorgenson; Allen, Dyer, Doppelt, Milbrath & Gilchrist, P.A.

(57) ABSTRACT

A method is for reducing a DC component of an input signal transposed into baseband and being generated by a first frequency transposition stage starting from an initial signal and from a transposition signal. The method includes amplifying the transposed input signal in a first amplifier. The first amplifier receives at a DC offset compensation input, a compensation signal extracted from an output signal of a second amplifier subjected to a compensation of a offset DC voltage of the second amplifier. The method also included alternating between receiving at an input of the second amplifier, a first auxiliary signal from an auto-transposition of a transposition signal in a second frequency transposition stage and a second auxiliary signal from a transposition of the initial signal in the second frequency transposition stage with the transposition signal.

21 Claims, 8 Drawing Sheets

METHOD AND DEVICE FOR THE REDUCTION OF THE DC COMPONENT OF A SIGNAL TRANSPOSED INTO BASEBAND, IN PARTICULAR IN A RECEIVER OF THE DIRECT CONVERSION TYPE

FIELD OF THE INVENTION

The invention relates to the frequency transposition of signals, notably, the reduction of the DC component of a signal transposed into baseband, in particular, in a receiver of the direct conversion type.

BACKGROUND OF THE INVENTION

A direct conversion receiver, known alternatively, as a zero intermediate frequency receiver (ZIF receiver) has a homodyne architecture and converts (transposes) the received signal, for example, a radio frequency signal, directly into baseband, i.e. around the 0 Hertz frequency. The advantages of such an architecture with the homodyne structure are the elimination of both the image processing and the intermediate frequency filters. For this reason, such a receiver is easier to integrate than a heterodyne receiver in which the conversion into baseband is carried out by way of one or more intermediate transpositions at intermediate frequencies.

However, a homodyne architecture may have drawbacks, which are notably the presence in the transposed signal of a DC offset, flicker noise, a greater sensitivity to leaks from the local oscillator generating the frequency transposition signal, and also to the mismatches between the two quadrature channels I and Q of the receiver system.

The DC offset may be a major drawback in the direct conversion architecture. The phenomenon, in fact, comprises of the appearance of a DC offset around the 0 Hertz frequency, which then leads to degradation of the performance of the receiver. It may important to eliminate this offset in the analog part of the receiver system, before the analog-digital conversion, in order to avoid saturating the digital processing elements in the baseband. This is because such saturation causes significant distortions of the signal.

Two types of DC offset can be differentiated, namely, a static DC offset and a dynamic DC offset, i.e. DC offset varies over time. From amongst the phenomena causing the static DC offset, several that may be mentioned are: the self-mixing of the local oscillator (the auto-transposition of the transposition signal supplied by this local oscillator) resulting from the leaks of the transposition signal into the RE signal input of the oscillator, the unbalancing between the two differential channels of the mixer, and the mismatch between the I and Q channels.

From amongst the phenomena causing the dynamic DC offset, several that may be mentioned are: the leakage from the mixer towards the antenna which may be modified depending on the environment and picked up, here again causing a self-mixing, and the RF signal leaks towards the oscillator and the even-order harmonic distortion. As indicated hereinabove, the self-mixing results from leaks occurring in the transposition signal generated by the local oscillator towards the signal input of the mixer or else towards the input of the low-noise amplifier generally disposed upstream of this mixer (and which may therefore amplify this leak). The transposition signal delivered by the local oscillator is then mixed with itself (auto-transposition), thus creating a DC component or DC offset. The level of this offset depends on the leaks and on the phase difference between the transposition signal and the leaks. The level of the resulting DC offset may then be higher than that of the desired signal. This offset is a static DC offset.

Furthermore, since the transposition signal is situated within the passband of the pre-selection filter disposed just after the antenna, it may perfectly well be envisaged that the leaks reach as far as the antenna where they are subsequently returned. In that case, the leaks from the local oscillator can interfere with other receivers in the wireless communications system, but also be reflected on external objects. Given that the environment can change, the leakage signal may change in amplitude and phase, then creating a dynamic DC offset.

Several methods for the suppression of DC noise signals exist. Amongst these may be mentioned the method comprising placing a capacitive high-pass filter in the receiver channel downstream of the frequency transposition stage in order to cut off the DC signal. However, such a system may be slow to tune and poses problems when establishing communications. Furthermore, the signal may be cut off at very low frequencies, which causes a degradation of the signal (loss of data).

Another approach comprises creating a negative feedback loop in the radio frequency channel, which then forms a negative feedback at the frequencies close to that of the DC offset, thus allowing it to be filtered. Another possible approach that may be mentioned is the extraction of the DC offset from the useful signal in order to be able to eliminate it in real-time by using a master-slave architecture comprising, notably, using a second channel called the "slave" and having the same characteristics as the main channel. However, such an approach may only allow the static DC offsets to be eliminated and not the dynamic DC offsets. Moreover, since all the components are doubled up, the power consumption of the circuit increases.

Another approach comprises placing a Miller integrator in negative feedback downstream of the frequency transposition stage of each of the channels I and Q in order to eliminate the offset. This loop is constructed around a variable-gain amplifier. The DC voltage difference at the output of each mixer is sensed by the Miller integrator, which has the effect of making the differential voltage at the output of the mixer vary. However, such an approach may have a drawback for the communications systems of the CDMA or WCDMA (Wide Band Code Division Multiple Access) type in which QPSK modulation is used. The reason for this is that the power spectrum of the signal comprises a component at 0 Hertz.

Now, such a approach with Miller integrator in negative feedback mode performs a blind suppression of the DC signal, in other words, it does not differentiate between the offset of the useful signal and the noise-signal offset. As a result, the final power spectrum of the signal may virtually no longer have any component around 0 Hertz. Moreover, the Miller integrator also degrades the signal close to 0 Hertz. Consequently, this may result in the DC offset noise signal being eliminated but at the expense of the quality of the received signal leading to many decoding errors and to a poor quality of reception.

SUMMARY OF THE INVENTION

An object of the present invention is to allow a reduction, or even elimination, of this DC offset without degrading the quality of the signal around 0 Hertz. Another object is to allow a partial reduction of the flicker noise (1/f noise) created within the receiver system, notably due to the presence of MOS transistors in the receiver system, in particular, in the frequency transposition stage of each of the I and Q channels.

A further object may be to allow a continuous reduction in the DC offset, which is particularly useful in WCDMA systems that operate on the 'full duplex' principle (simultaneous transmission and reception) as opposed to TDMA systems that operate in time-share mode (reception and transmission at different times); nevertheless, the approach may also be applied to such systems.

According to one aspect, a method is provided for reducing the DC component of a main signal transposed into baseband and delivered by a main frequency transposition stage starting from an initial signal, for example, a radio frequency signal, and from a transposition signal. According to a general feature of this aspect, the method comprises an amplification of the transposed signal in a main amplifier. The main amplifier receives, at its DC offset compensation input (offset compensation input), a main compensation signal extracted from the output signal of an auxiliary amplifier subjected to a compensation of its offset DC voltage (offset compensation), and alternately, receiving at its input, a first auxiliary signal resulting from an auto-transposition of the transposition signal in an auxiliary frequency transposition stage. The auxiliary frequency transposition stage may be structurally analogous to the main frequency transposition stage, and a second auxiliary signal results from the transposition of the initial signal in the auxiliary transposition stage with the transposition signal.

In other words, one particular provision of this method is to use an auxiliary mixer receiving the transposition signal delivered by the local oscillator whose signal input may or may not be connected to the channel in question (I or Q channel). An auxiliary amplifier receives the signal delivered by the auxiliary mixer and is continuously subjected to a compensation of its offset DC voltage. Furthermore, another amplifier, here referred to as "main amplifier", is connected to the output of the mixer of the channel in question, and also receives at its offset compensation input a compensation signal which is still extracted from the output signal of the auxiliary amplifier, whichever alternation cycle is being considered. The main amplifier output signal is therefore a signal having a reduced DC component, and is in practice may be virtually eliminated, with respect to the signal delivered by the mixer of the channel in question.

According to one embodiment, when the auxiliary amplifier receives the second auxiliary signal at its input, in other words, the signal resulting from the transposition of the initial signal with the transposition signal, the output signal from the auxiliary amplifier may be filtered in a resistive-capacitive low-pass filter. The filter capacitor is charged with the output signal of the auxiliary amplifier, and the main compensation signal is then the filtered signal. In contrast, when the auxiliary amplifier receives the first auxiliary signal at its input, in other words, the signal resulting from the auto-transposition of the transposition signal, the main compensation signal may be the signal restored by the capacitor of the filter.

According to another embodiment, when the auxiliary amplifier receives the first auxiliary signal at its input, the compensation of the offset DC voltage of the auxiliary amplifier comprises a feedback of the output of the auxiliary amplifier into its DC voltage offset compensation input via a capacitive integrator. When the auxiliary amplifier receives the second auxiliary signal at its input, the compensation of the offset DC voltage of the auxiliary amplifier comprises the restoring of the signal stored in the capacitor of the integrator. The integrator is, for example, a Miller integrator.

It should be noted here that, in contrast to the prior art in which the Miller integrator was directly connected to the main channel (I or Q channel), which may not allow the power of the signal contained at 0 Hertz to be conserved, here the Miller integrator is connected to the output of the auxiliary amplifier during one of the alternation cycles, which may prevent the quality of the signal from being degraded.

In order to continuously maintain a compensation of the DC offset voltage of the auxiliary amplifier, the time constant of the integrator may be advantageously chosen to be shorter than the duration of each of the alternation cycles. Furthermore, the frequency of the initial signal is, for example, higher than the switching frequency of the two alternation cycles.

According to another aspect, a device is provide, the device comprising a main input for receiving a main signal transposed into baseband delivered by a main frequency transposition stage starting from an initial signal and from a transposition signal, processing means or a processor having an output for delivering an output signal having a DC component that may be reduced with respect to that of the main signal.

According to a general feature of this other aspect, the processing means comprise a main amplifier connected between the main input and the output and having a DC offset compensation input, an auxiliary frequency transposition stage being structurally analogous to the main frequency transposition stage and capable of alternately delivering a first auxiliary signal resulting from an auto-transposition of the transposition signal and a second auxiliary signal resulting from the transposition of the initial signal with the transposition signal and, an auxiliary amplifier whose input is connected to the output of the auxiliary frequency transposition stage. The processing means also comprise an auxiliary compensation means or an auxiliary compensator capable of compensating the DC offset of the auxiliary amplifier, and generation means or a generator capable of generating a compensation signal starting from the output signal of the auxiliary amplifier and of delivering it to the compensation input of the main amplifier.

According to another embodiment, the auxiliary compensation means comprise a capacitive integrator whose output is connected to the compensation input of the auxiliary amplifier. The compensation input is capable of being connected to the output of the auxiliary amplifier when the auxiliary transposition stage delivers the first auxiliary signal, and is capable of being disconnected from the output of the auxiliary amplifier when the auxiliary transposition stage delivers the second auxiliary signal.

According to another embodiment, the generation means comprise a resistive-capacitive low-pass filter, the common terminal between the resistor and the capacitor of the filter being connected to the compensation input of the main amplifier. The input of the low-pass filter is capable of being connected to the output of the auxiliary amplifier when the auxiliary processing stage delivers the second auxiliary signal and capable of being disconnected from the output of the auxiliary amplifier when the auxiliary processing stage delivers the first auxiliary signal.

According to another embodiment, the auxiliary frequency transposition stage comprises a first input for receiving the transposition signal and a second input or signal input. The processing means also comprise an auxiliary input for receiving the initial signal, a first switching means or a switch connected between the second input of the auxiliary frequency transposition stage and the auxiliary input, and control means or a controller capable of alternately placing the first switching means into an open state so as to obtain the first auxiliary signal and into a closed state so as to obtain the second auxiliary signal.

According to another embodiment, a second switching means or second switch is connected between the output of the auxiliary amplifier and the input of the integrator, a third switching means or a third switch is connected between the output of the auxiliary amplifier and the input of the low-pass filter, and the control means are capable of: placing the second switching means into a closed state, placing the third switching means into an open state when the first switching means is open, and placing the second switching means into a open state and the third switching means into a closed state when the first switching means is closed.

The frequency of the initial signal may be advantageously higher than the switching frequency of the two alternation cycles. A receiver of the direct conversion type is provided and incorporates a device such as is defined hereinabove. This receiver can belong to a wireless communications system of the CDMA type and form, for example, a cellular mobile telephone.

BRIEF DESCRIPTION OF THE DRAWINGS

Other advantages and features of the invention will become apparent upon examination of the detailed description of non-limiting embodiments and their implementation, and of the appended drawings in which.

DETAILED DESCRIPTION OF THE PREFERRED EMBODIMENTS

Figure 1:
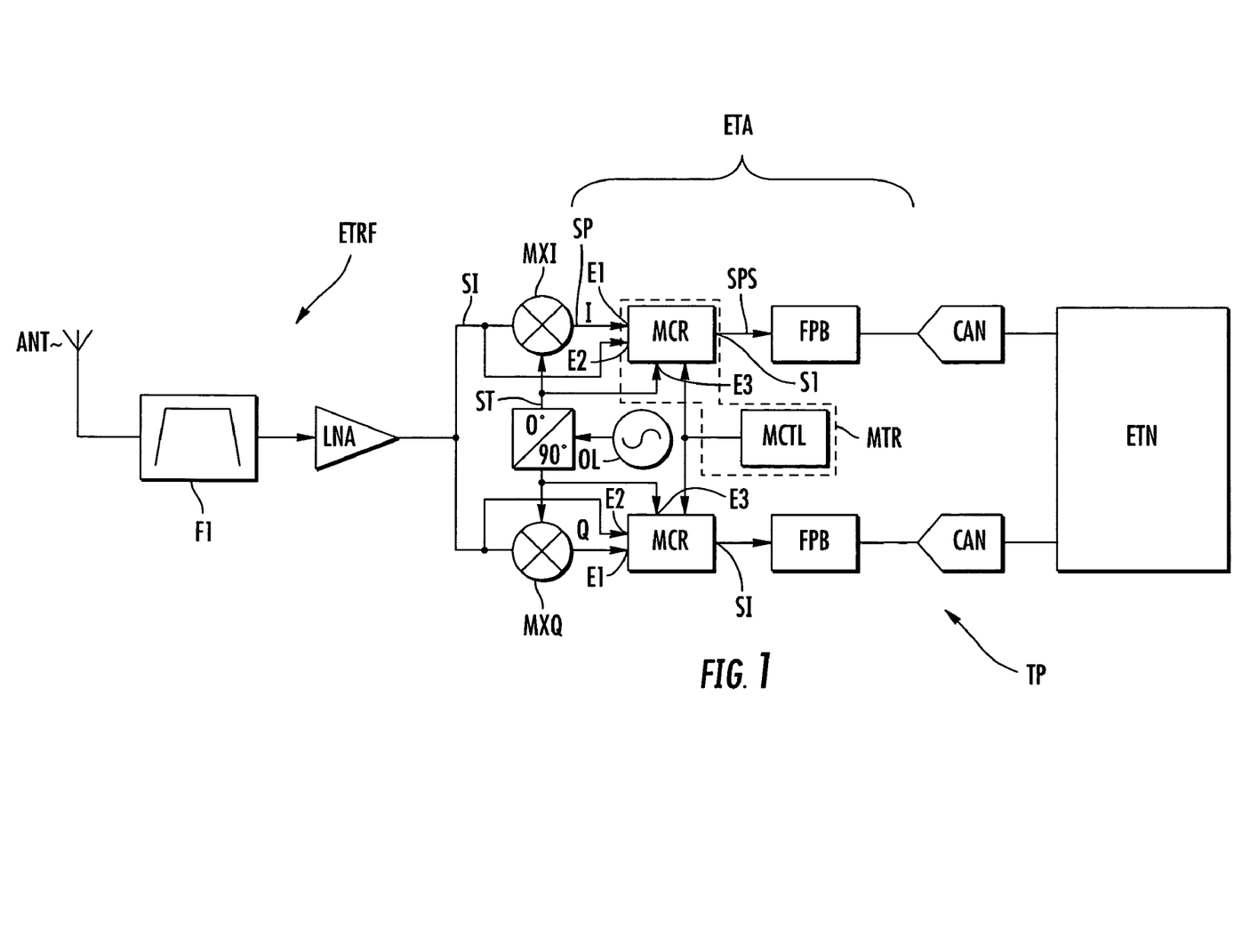
FIG. 1 illustrates one embodiment of a receiver of the direct conversion type incorporating a device according to the invention.

In FIG. 1, the reference TP denotes a receiver of the direct conversion type, for example, a cellular mobile telephone belonging to a wireless communications system, for example, of the WCDMA type, although these embodiments are not limited to this type of system. The receiver TP comprises an antenna receiving a radio frequency signal which is firstly filtered in a bandpass pre-selection filter F1 in order to attenuate the out-of-band signals then amplified in a low-noise amplifier LNA before being converted directly into baseband within two frequency transposition stages or mixers, referenced MXI and MXQ.

Each of these mixers receives a transposition signal ST delivered by a local oscillator whose frequency is equal to that of the desired channel contained in the initial signal SI delivered by the amplifier LNA. The transposition signal delivered to the mixer MXQ is phase-shifted by 90° with respect to the transposition signal delivered to the mixer MXI so as to obtain, after mixing, the two conventional processing channels I and Q in phase quadrature.

Aside from the mixers, the two channels I and Q also comprise low-pass filters FPB designed to eliminate the mixing residues. The analog stage ETA is then connected to a digital baseband processing stage ETN via an analog-digital conversion stage CAN. However, the signal coming from the mixer of each of the channels, for example, the signal delivered on the I channel and referenced SP, which is denoted as "main signal" in the following, exhibits a DC voltage offset.

Figure 5:
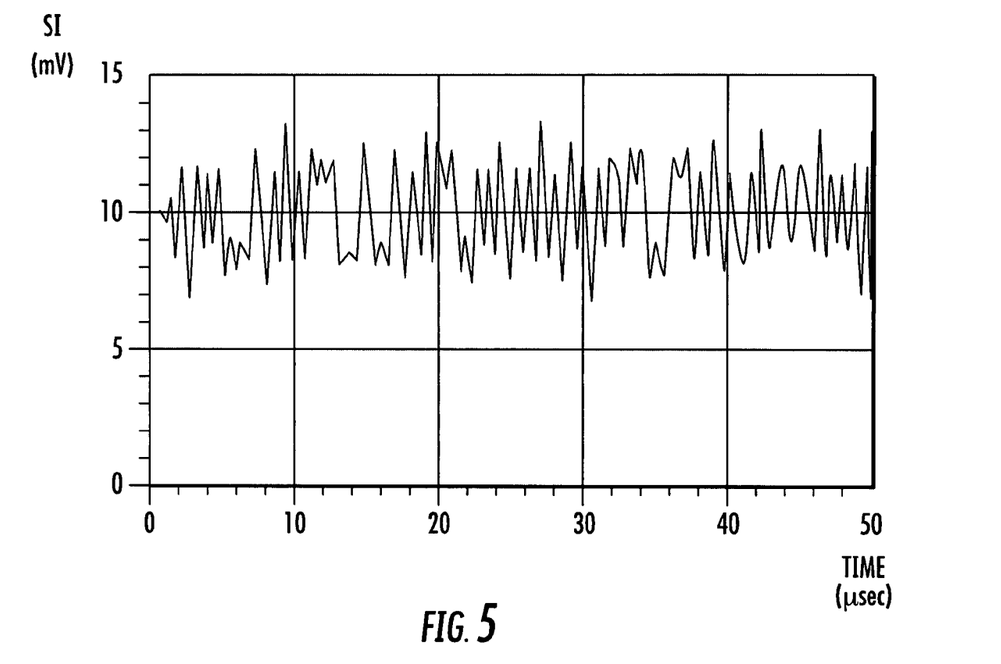

By way of example, a main signal SP is illustrated in FIG. 5. In this example, the frequency of the local oscillator is equal to 2 GHz. The main signal SP delivered on the I channel by the mixer MXI has a peak-to-peak amplitude of around 6 millivolts, but also a large offset (DC offset voltage), here having a value of 10 millivolts. If this signal were directly processed as such, the following stages may be be saturated and the reception completely erroneous.

For this reason, this embodiment provides for a device capable of reducing the DC component of the main signal SP transposed into baseband to be placed downstream of each mixer MXI and MXQ. Such a device, which is described in more detail with reference to FIG. 2, comprises a main input E1 for receiving the main signal SP transposed into baseband delivered by the frequency transposition stage, that is here referred to as "main frequency transposition stage".

Figure 2:
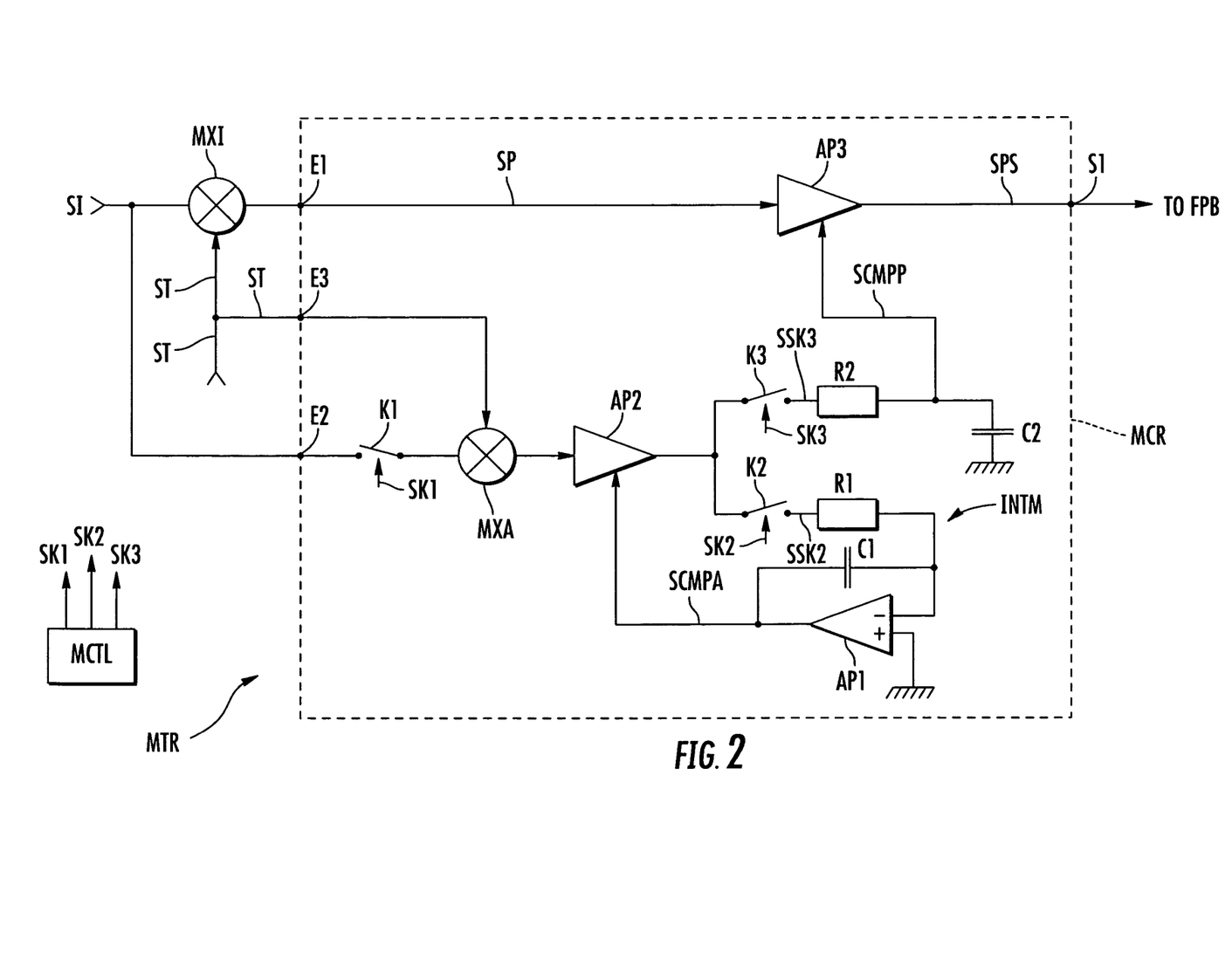
FIG. 2 illustrates in more detail, one embodiment of a device according to the invention.

The device also comprises processing means MTR comprising, as is seen hereinafter, correction means MCR controlled by control means MCTL. The processing means MTR, and more particularly the correction means MCR, possess an output S1 for delivering an output signal SPS having a DC component that is reduced with respect to that of the main signal SP. It goes without saying that the channel Q is also equipped with the same processing means MTR. However, the control means MCTL can be common to each of the correction means MCR placed in each of the channels I and Q.

In the following, only one of the two channels I and Q, for example, the channel I, may be considered given that everything going to be described hereinafter is also applicable to the channel Q. Reference is now more particularly made to FIG. 2 in order to describe one embodiment of the device.

In FIG. 2, an architecture of the single-ended type is illustrated. This embodiment is of course also applicable to an architecture of the differential type. The correction means or a corrector MCR of the processing means comprise a main amplifier AP3 connected between the main input E1 and the output S1. This main amplifier AP3 has a DC voltage offset compensation input. This input is an additional input for eliminating the offset of the amplifier.

The correction means MCR also comprise an auxiliary frequency transposition stage, or auxiliary mixer MXA, structurally analogous to the main mixer MXI. The correction means MCR comprise a transposition input ES designed to receive the transposition signal ST and to which a first input or transposition input of the mixer MXA is connected. Furthermore, the correction means MCR comprise an auxiliary input E2 for receiving the initial signal SI.

The second input or signal input of the auxiliary mixer MXA is connected to the auxiliary input E2 via a first switching means or switch K1 which, for example, takes the form of a transistor. This first switch K1 is controlled by a control signal SK1 delivered by the control means MCTL. Thus, the first switch can be set either in an open state or in a closed state, depending on the logic value of the signal SK1.

An auxiliary amplifier AP2, also comprising an additional offset elimination input, is connected to the output of the auxiliary mixer MXA. The correction means MCR also comprise auxiliary compensation means capable of compensation for the DC offset voltage (offset) of the auxiliary amplifier AP2. These auxiliary compensation means here comprise a Miller capacitive integrator INTM whose input is connected to the output of the auxiliary amplifier AP2 via a second switching means or switch K2. The switch K2 is controlled by a logic signal SK2 also delivered by the control means MCTL.

The output of the Miller integrator INTM, which delivers an auxiliary compensation signal SCMPA, is connected to the offset compensation input of the auxiliary amplifier AP2. The structure of a Miller integrator is conventional and known. It comprises a resistor R1 connected to the inverting input of an amplifier AP1. Furthermore, a capacitor C1 is disposed between the inverting input of the amplifier AP1 and the output of the latter The correction means MCR of the processing means also comprise generation means capable of generating a main compensation signal SCMPP starting from the output signal of the auxiliary amplifier AP2 and of delivering it to the compensation input of the main amplifier AP3. These generation means here comprise a low-pass resistive-capacitive filter R2, C2. The common terminal between the resistor R2 and the capacitor C2 of the filter is connected to the offset compensation input of the main amplifier AP3.

Furthermore, the input of the low-pass filter, in other words the other terminal of the resistor R2, is connected to the output of the auxiliary amplifier AP2 via a third switching means or switch K3 controlled by a logic signal SK3 emitted by the control means MCTL. The control means MCTL can be formed from logic gates and logic circuits. They may also themselves be controlled or activated by the baseband processor contained within the digital processing stage ETN.

Reference is now more particularly made to FIGS. 3, 4, and 6-11, in order to illustrate the operation of the device. Generally speaking, the operation may be divided into two phases implemented alternately at a given switching frequency, which is the switching frequency of the switches. By way of example, for a local oscillator frequency of 2 GHz, the switching frequency may be chosen as equal to 100 MHz.

Figure 3:
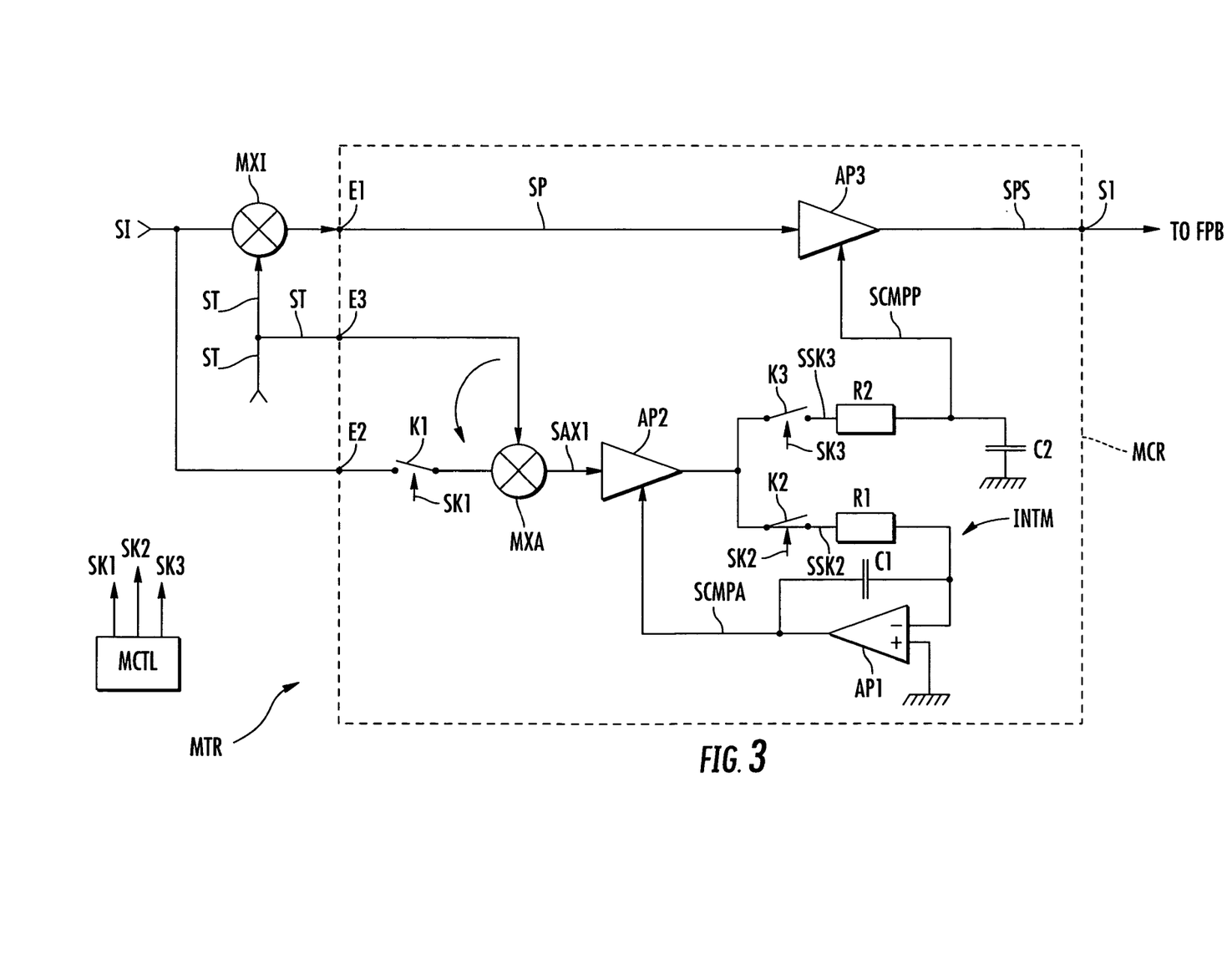
FIGS. 3 and 4 illustrate schematically two phases of operation implemented alternately in a device according to the invention, and, FIGS. 5 to 11 illustrate curves that are representative of the operation of a device according to the invention and of one implementation of the method according to the invention.

In a first phase, the input of the auxiliary mixer MXA is open (switch K1 open). Thus, the amplifier AP2 may "feel" the DC component created by the leaks from the auxiliary mixer MXA together with the 1/f noise, then allowing the Miller integrator INTM to eliminate this offset. This DC component is a kind of image created by the main mixer MXI, since the auxiliary and main mixers have analogous characteristics.

Figure 4:
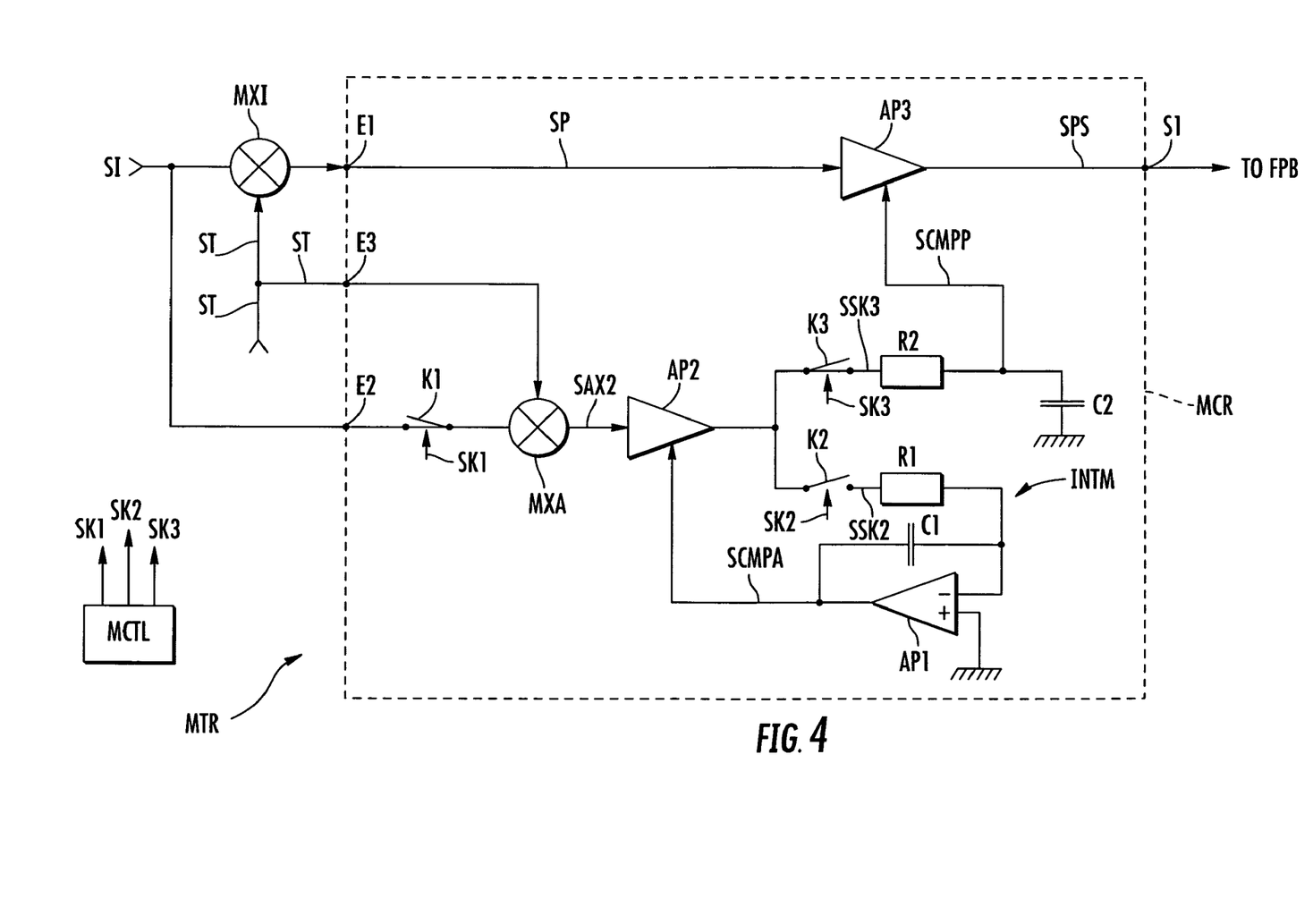

In a second phase, the switch K1 is closed and the output of the auxiliary amplifier AP2 is connected to the low-pass filter R2C2. During this phase, the capacitor of the Miller integrator continues to compensate the previously measured offset. Consequently, if $A_n$ denotes the amplification gain of the auxiliary amplifier AP2 and $B_m$ the gain on the compensation input of the main amplifier AP3, the signal coming from the auxiliary mixer MXA is amplified by a factor $A_n*B_m$ and added to the signal of the main channel I.

It is then shown that the total gain on the main channel is equal to $A_m+A_n*B_m$, where $A_m$ denotes the amplification gain of the main amplifier AP3. This total gain can in fact be approximated to the product $A_n*B_m$ because this product is much greater than the gain $A_m$. Furthermore, the effective offset of the device is then approximately equal to the sum of the offsets of the two amplifiers divided by the gain $A_n$ of the auxiliary amplifier AP2.

Thus, the principle according to these embodiments amounts to dividing an offset by the value of the gain $A_n$, in contrast to the systems of the prior art that offer an elimination of the offset by subtraction of a signal. Of course there may always be a noise-signal offset, but this may be negligible.

After this general explanatory overview, reference is now more particularly made to FIG. 3 in order to describe the first phase of operation of the device. In FIG. 3, the flow of the various signals, also corresponding to the states of the various switches, is illustrated in bold.

More precisely, this first phase corresponds to a phase for elimination of the DC offset voltage (or offset) of the auxiliary amplifier APR. In this respect, the auxiliary amplifier AP2 is disconnected from the main channel (I channel) (switch K1 open), and its output is fed back onto its offset compensation input via the Miller integrator INTM (switch K2 closed and switch K3 open).

The auxiliary amplifier AP2 therefore receives at its input a first auxiliary signal SAX1 resulting, because of the mixing leaks, from an auto-transposition into baseband of the transposition signal ST. In this first phase, a DC voltage equal to the opposite of the DC offset voltage (offset) created by the auxiliary mixer MXA may be present at the output of the Miller integrator.

In this phase, the main compensation signal SCMPP delivered to the compensation input of the main amplifier AP3 is equal to the voltage restored by the capacitor C2 of the low-pass filter, which capacitor has been charged up during the second phase of the preceding alternation cycle.

This second phase is illustrated in FIG. 4. Here again the flow of the various signals, also corresponding to the states of the various switches, is illustrated in bold. In this case, the auxiliary amplifier AP2 is connected into the main channel (switch K1 closed) and, the voltage accumulated across the terminals of the capacitor C1 of the Miller integrator continues to compensate the offset of the auxiliary amplifier APR.

Furthermore, while the switch K2 is open, the switch KS3 is closed. For this reason, the compensation signal SCMPP delivered to the signal compensation input of the amplifier APS is equal to the output signal of the amplifier AP2, which is filtered by the low-pass filter R2C2. In addition, the capacitor C2 of the low-pass filter charges up.

Since the switch K1 is closed, the input of the auxiliary amplifier AP2 receives a second auxiliary signal SAX2, which this time results from the transposition of the initial signal SI with the transposition signal ST.

Figure 6:
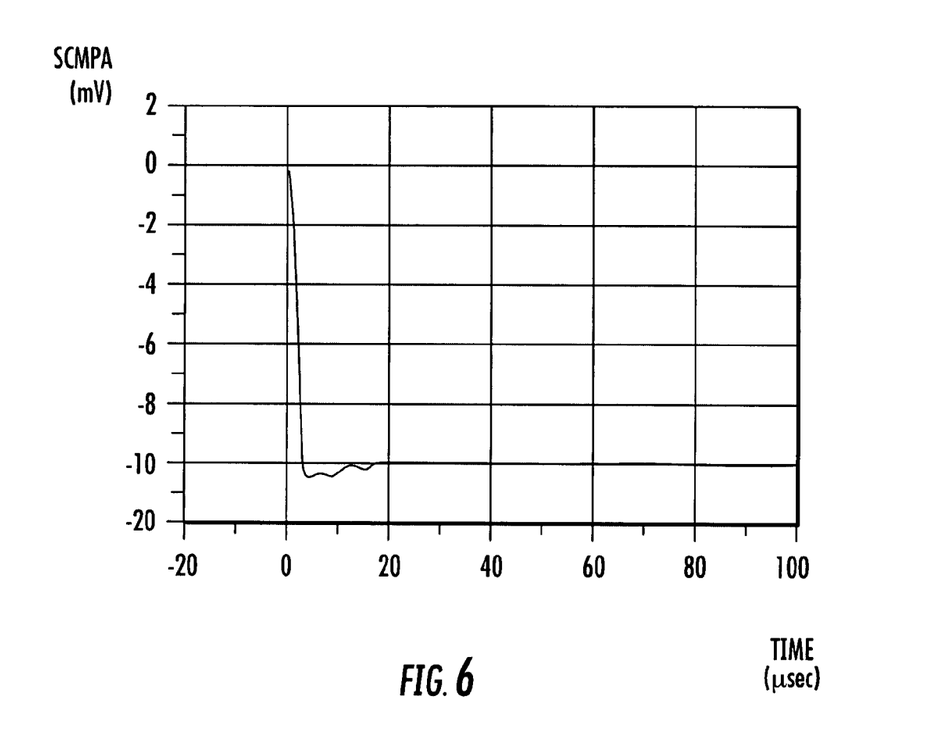

Reference is now more particularly made to FIGS. 6-11 in order to complete this illustration of the operation of the device according to these embodiments. In FIG. 6, the time variation of the auxiliary compensation signal SCMPA, in other words, the output signal from the Miller integrator, is illustrated. It can be seen that, after an establishment phase, the latter stabilizes at the value −10 millivolts corresponding to the DC component of the main signal SP.

Since, in this example, the switching frequency of the switches is 100 MHz, a value of 1 kΩ has therefore advantageously been chosen for the resistor R1 of the Miller integrator and for the capacitor C1 of this integrator a value of 1 pF. The choice of these values allows a time constant for the integrator to be obtained that is much shorter than the duration of the alternation cycles, thus allowing a continuous compensation to be maintained. Indeed, the noise-signal offset of the operational amplifier AP2 may be compensated during the two phases of operation.

Figure 7:
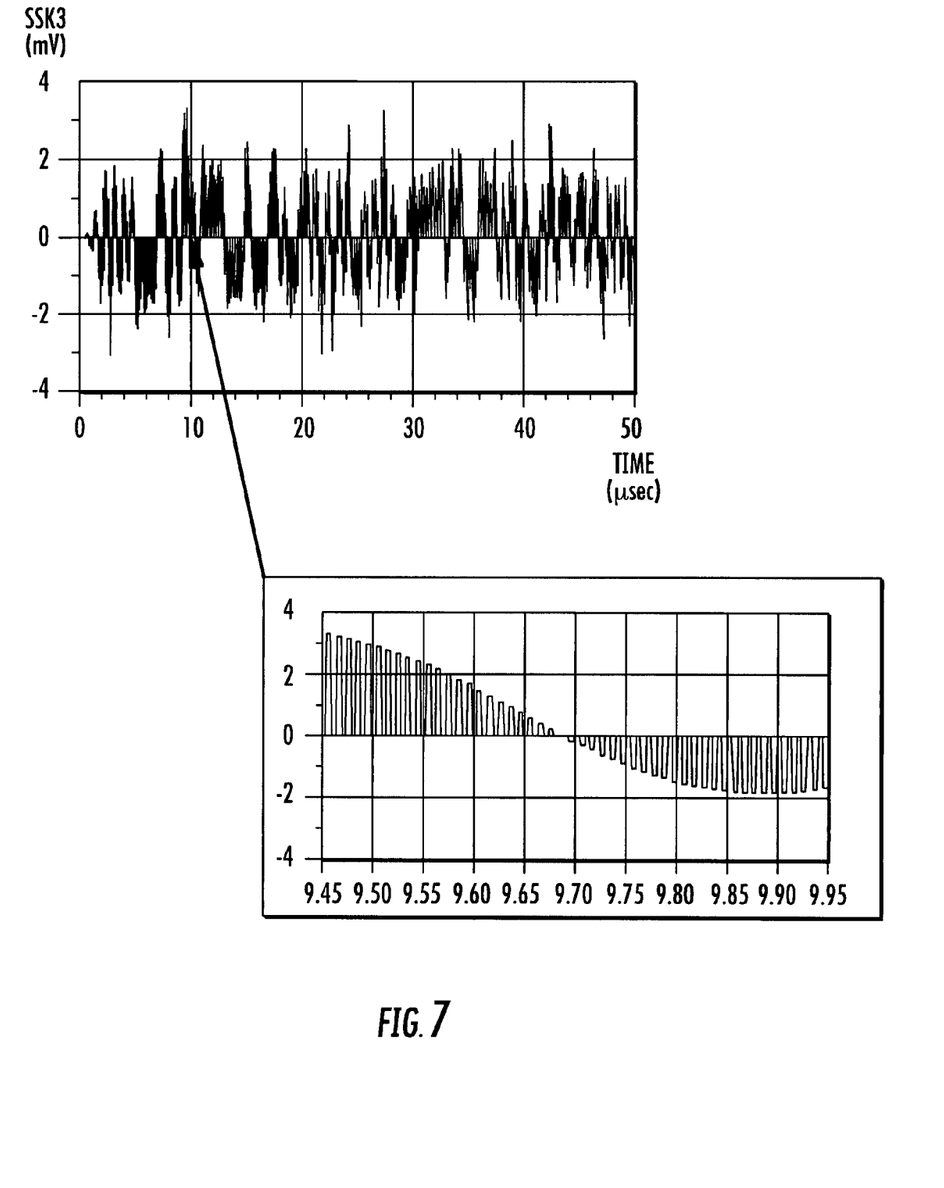
Figure 8:
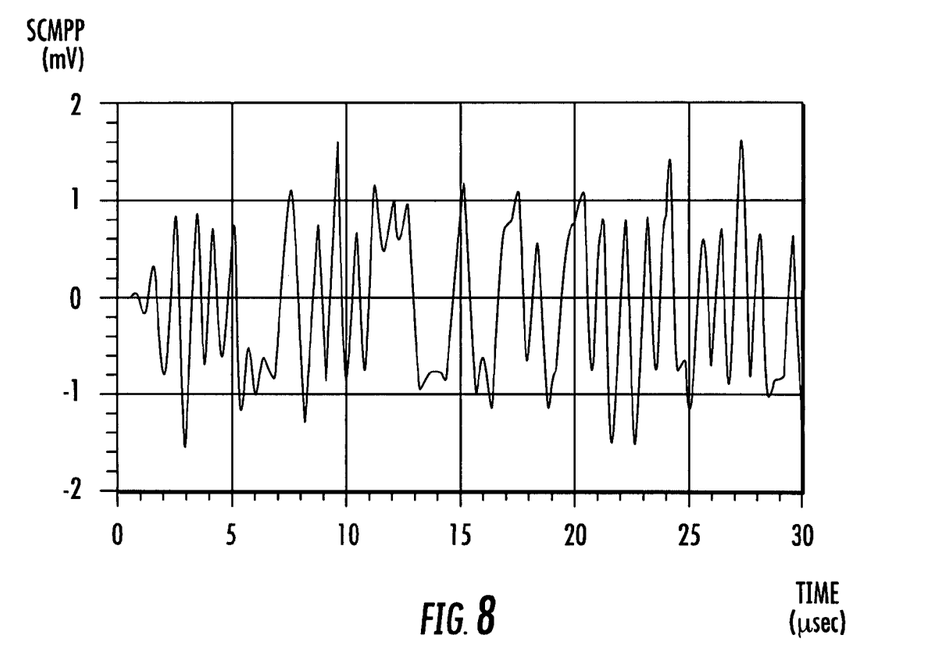

FIG. 7 illustrates the time variation of the signal SSK3 at the output of the switch K3. It can be seen that this signal SSK3 is a chopped signal. The low-pass filter R2C2 allows a continuous compensation signal SCMPP to be obtained, starting from this chopped signal, so as to be able to deliver it to the compensation input of the main amplifier AP3.

It is furthermore recalled that, during the second phase, the capacitor C2 is going to charge up, and thus restore the signal when the device returns to the first phase. The absence of an offset in the signal SSK3 may also be noted.

Figure 9:
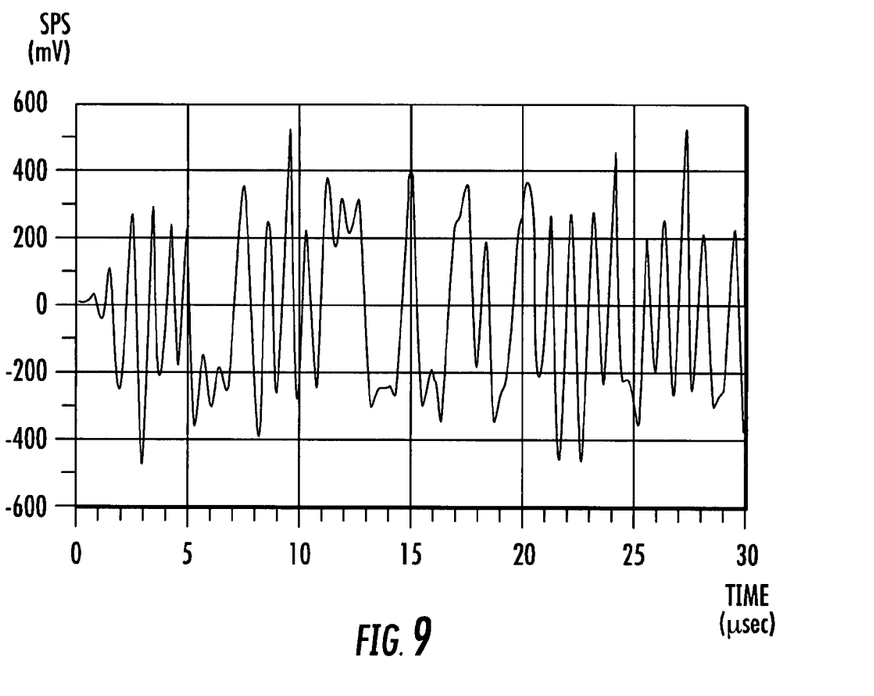

This filtered signal SCMPP is delivered to the compensation input of the main amplifier having a gain $B_m$. It is then added to the signal SP amplified with a gain $A_m$ coming from the output of the main mixer MX1. FIG. 9 illustrates the time variation of the signal SPS present at the output of the amplifier AP3. It may be noted that the peak-to-peak amplitude of the signal SPS is slightly higher than 800 millivolts. On the other hand, the DC component present in this signal SPS has been almost totally eliminated.

The fact that the amplitude of this signal SPS is higher than that of the signal SP originates from the fact that the auxiliary correction channel has a gain equal to $A_n*B_m$, whereas the main channel I has a gain equal to $A_m$ being lower than the gain of the auxiliary channel.

Figure 10:
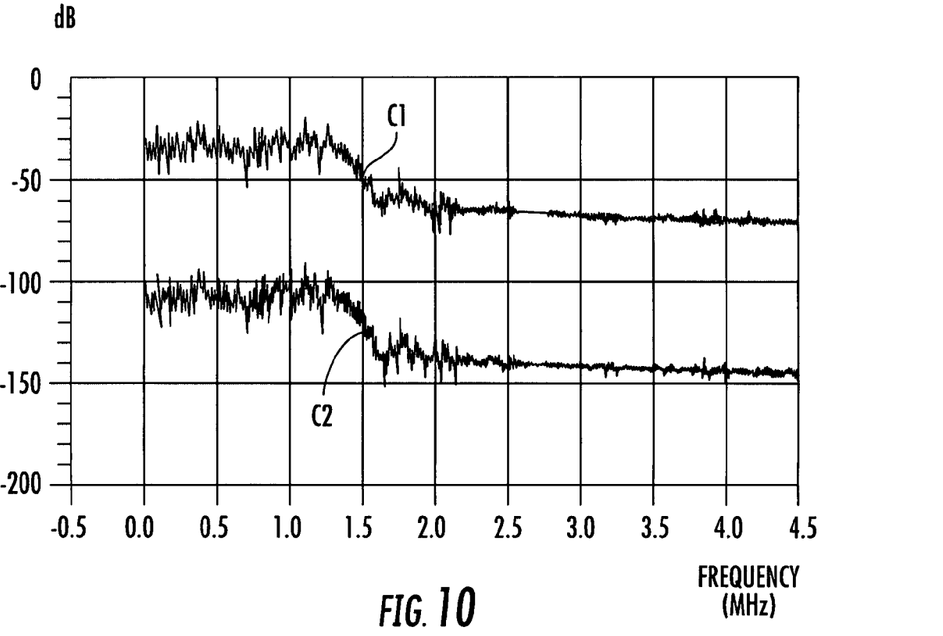

FIG. 10 illustrates the output spectrum of the signals present in the main channel I. More precisely, the curve C1 is the frequency spectrum of the main signal S1, whereas the curve C2 is the frequency spectrum of the output signal SPS. The output spectrum of the signal SPS is of course amplified; however, the power contained at 0 Hz in the signal SP is conserved.

Figure 11:
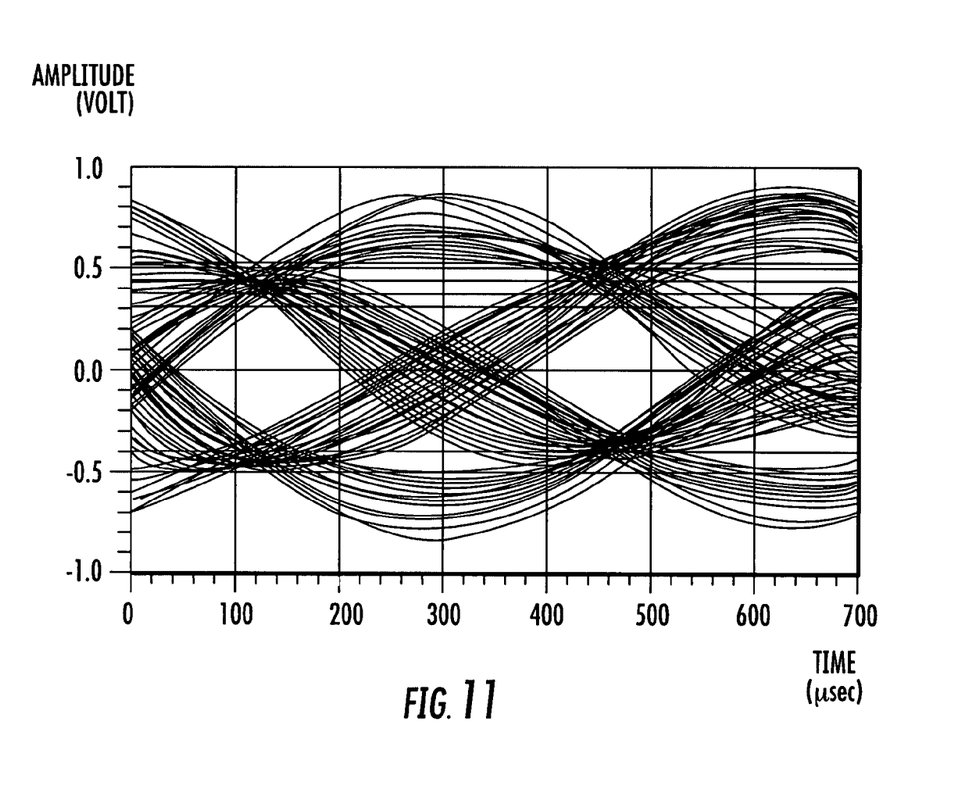

If reference is now made to the eye diagram of the I channel at the output of the main amplifier AP3, it is observed that this eye is clearly open (four very distinct and symmetrical groupings with respect to the origin), which is synonymous with a reception of high-quality thus allowing a faithful demodulation.

The device according to these embodiments may allow the static and dynamic DC offset to be corrected in a continuous fashion, which is perfectly suited to "full duplex" systems, while at the same time conserving the power of the signal contained at 0 Hz. In addition, a partial reduction in the 1/f noise created in the receiver circuitry is obtained, while at the same time obtaining an almost total elimination of the offsets caused by the leaks from the mixer.

That which is claimed:

1. A method for reducing a DC component of an input signal transposed into baseband and being generated by a first frequency transposition stage from an initial signal and from a transposition signal, the method comprising:
    amplifying the transposed input signal in a first amplifier, the first amplifier receiving at a DC offset compensation input, a compensation signal extracted from an output signal of a second amplifier subjected to a compensation of a offset DC voltage of the second amplifier; and
    alternating between receiving at an input of the second amplifier, a first auxiliary signal from an auto-transposition of a transposition signal in a second frequency transposition stage and a second auxiliary signal from a transposition of the initial signal in the second frequency transposition stage with the transposition signal.

2. The method according to claim 1 wherein when the second amplifier receives the second auxiliary signal at its input, the output signal from the second amplifier is filtered in a resistive-capacitive low-pass filter; wherein the capacitor of the low-pass filter is charged with the output signal of the second amplifier; wherein the compensation signal comprises the filtered signal; and wherein when the second amplifier receives the first auxiliary signal at its input, the compensation signal comprises a signal restored by the capacitor of the low-pass filter.

3. The method according to claim 1 wherein when the second amplifier receives the first auxiliary signal at its input, the compensation of an offset DC voltage of the second amplifier comprises a feedback of the output signal of the second amplifier into a DC voltage offset compensation input of the second amplifier through a capacitive integrator; and wherein when the second amplifier receives the second auxiliary signal at its input, the compensation of the offset DC voltage of the second amplifier comprises restoration of the signal stored in the capacitor of the capacitive integrator.

4. The method according to claim 3 wherein the capacitive integrator comprises a Miller integrator.

5. The method according to claim 3 wherein a time constant of the capacitive integrator is less than a duration of each alternation cycle.

6. The method according to claim 1 wherein a frequency of the initial signal is greater than a switching frequency of the alternation cycles.

7. The method according to claim 1 wherein the initial signal comprises a radio frequency signal.

8. The method according to claim 7 wherein the radio frequency signal comprises a signal according to a CDMA standard.

9. A device comprising:
    a first frequency transposition stage receiving an initial signal and a transposition signal;
    a first input for receiving an input signal transposed into baseband delivered by said first frequency transposition stage; and
    a processor having an output for delivering an output signal having a DC component being reduced with respect to the input signal, said processor comprising
        a first amplifier coupled between said first input and the output of said processor and having a DC offset compensation input,
        an second frequency transposition stage for alternately delivering a first auxiliary signal from an auto-transposition of the transposition signal and a second auxiliary signal from the transposition of the initial signal with the transposition signal,
        an second amplifier having an input connected to an output of said second frequency transposition stage,
        an auxiliary compensator for compensating a DC offset of said second amplifier, and
        a generator generating a compensation signal starting from an output signal of said second amplifier and delivering the compensation signal to the DC offset compensation input of said first amplifier.

10. The device according to claim 9 wherein said auxiliary compensator comprises a capacitive integrator having an output being connected to a DC offset compensation input of said second amplifier; wherein an input of said capacitive integrator is connected to an output of said second amplifier when said second frequency transposition stage delivers the first auxiliary signal; and wherein the input of said capacitive integrator is disconnected from the output of said second amplifier when said second frequency transposition stage delivers the second auxiliary signal.

11. The device according to claim 10 wherein said capacitive integrator comprises a Miller integrator.

12. The device according to claim 10 wherein a time constant of said capacitive integrator is less than a duration of each alternation cycle.

13. The device according to claim 10 wherein said second frequency transposition stage comprises a first input for receiving the transposition signal and a second input; said processor further comprising
    an auxiliary input for receiving the initial signal,
    a first switch connected between the second input of said second frequency transposition stage and said auxiliary input, and
    a controller alternately placing the first switch into an open state for the first auxiliary signal and into a closed state for the second auxiliary signal.

14. The device according to claim 13 wherein said processor further comprises a second switch connected between the output of said second amplifier and the input of said capacitive integrator, and a third switch being connected between the output of said second amplifier and the input of the low-pass filter; and wherein said controller is for placing said second switch into a closed state and said third switch into an open state when said first switch is open, and placing said second switch into an open state and said third switch into a closed state when said first switch is closed.

15. The device according to claim 9 further comprising an auxiliary processor; wherein said generator comprises a resistive-capacitive low-pass filter having a common terminal; wherein said common terminal between the resistor and the capacitor of said low-pass filter is connected to the DC offset compensation input of said first amplifier; wherein an input of said low-pass filter being connected to the output of said second amplifier when said auxiliary processor delivers the second auxiliary signal and being disconnected from the output of said second amplifier when said auxiliary processor delivers the first auxiliary signal.

16. The device according to claim 9 wherein a frequency of the initial signal is greater than a switching frequency of the alternation cycles.

17. The device according to claim 9 wherein the initial signal comprises a radio frequency signal.

18. An electronic device having a direct conversion type receiver of a wireless communication system comprising:

a first frequency transposition stage for receiving an initial signal and a transposition signal and producing an input signal transposed into baseband; and a processor having an output for delivering an output signal having a DC component being reduced with respect to the input signal and an input for receiving the input signal, said processor comprising a first amplifier coupled between the input of said processor and the output of said processor and having a DC offset compensation input, an second frequency transposition stage for alternately delivering a first auxiliary signal from an auto-transposition of the transposition signal and a second auxiliary signal from the transposition of the initial signal with the transposition signal, an second amplifier having an input connected to an output of said second frequency transposition stage, an auxiliary compensator for compensating a DC offset of said second amplifier, and a generator generating a compensation signal starting from an output signal of said second amplifier and delivering the compensation signal to the DC offset compensation input of said first amplifier.

19. The electronic device according to claim 18 wherein said auxiliary compensator comprises a capacitive integrator having an output being connected to a DC offset compensation input of said second amplifier; wherein an input of said capacitive integrator is connected via a switch to an output of said second amplifier when said second frequency transposition stage delivers the first auxiliary signal; and wherein the input of said capacitive integrator is disconnected from the output of said second amplifier when said second frequency transposition stage delivers the second auxiliary signal.

20. The electronic device according to claim 18 wherein the wireless communications system comprises a CDMA type wireless communication system.

21. The electronic device according to claim 18 further comprising a cellular mobile telephone.

* * * * *

UNITED STATES PATENT AND TRADEMARK OFFICE
CERTIFICATE OF CORRECTION

| | | |
|---|---|---|
| PATENT NO. | : 7,787,853 B2 | Page 1 of 2 |
| APPLICATION NO. | : 11/774021 | |
| DATED | : August 31, 2010 | |
| INVENTOR(S) | : Belot et al. | |

It is certified that error appears in the above-identified patent and that said Letters Patent is hereby corrected as shown below:

Abstract, Line 8
Delete: "of a offset"
Insert: --of an offset--

Column 1, Line 38
Delete: "may important"
Insert: --may be important--

Column 1, Line 49
Delete: "RE"
Insert: --RF--

Column 3, Line 39
Delete: "is"

Column 4, Line 11
Delete: "provide"
Insert: --provided--

Column 6, Line 5
Delete: "be be"
Insert: --be--

Column 6, Line 41
Delete: "ES"
Insert: --E3--

Column 7, Line 4
Delete: "latter"
Insert: --latter.--

Column 7, Line 66
Delete: "APR"
Insert: --AP2--

Column 8, Line 23
Delete: "KS3"
Insert: --K3--

Signed and Sealed this
Twenty-eighth Day of June, 2011

David J. Kappos
*Director of the United States Patent and Trademark Office*

CERTIFICATE OF CORRECTION (continued)
U.S. Pat. No. 7,787,853 B2

Column 8, Line 26                Delete: "APS"
                                            Insert: --AP3--

Column 10, Line 25              Delete: "an"
                                            Insert: --a--

Column 10, Line 30              Delete: "an"
                                            Insert: --a--

Column 12, Line 4                 Delete: "an"
                                            Insert: --a--

Column 12, Line 9                 Delete: "an"
                                            Insert: --a--